United States Patent
Reis

(10) Patent No.: US 7,881,685 B2
(45) Date of Patent: Feb. 1, 2011

(54) AMPLIFIER GAIN CONTROL

(75) Inventor: Ricardo dos Santos Reis, Turcifal (PT)

(73) Assignee: Synopsys, Inc., Mountain View, CA (US)

(*) Notice: Subject to any disclaimer, the term of this patent is extended or adjusted under 35 U.S.C. 154(b) by 579 days.

(21) Appl. No.: 11/968,108

(22) Filed: Dec. 31, 2007

(65) Prior Publication Data
US 2009/0170460 A1    Jul. 2, 2009

(51) Int. Cl.
 *H04B 1/06* (2006.01)
(52) U.S. Cl. ............... 455/240.1; 455/334; 375/345
(58) Field of Classification Search ........... 455/230, 455/242.1, 234.1, 240.1, 324, 333, 334, 339, 455/341; 375/345
See application file for complete search history.

(56) References Cited

U.S. PATENT DOCUMENTS 6,577,852 B1*  6/2003  Iwata et al. ........... 455/240.1
6,870,891 B2*  3/2005  Wu et al. ............... 375/345
7,482,958 B2*  1/2009  Tanaka et al. .......... 341/139
7,680,224 B2*  3/2010  Hegyi et al. ........... 375/344
2006/0146914 A1*  7/2006  Horvath et al. ......... 375/137
2008/0165899 A1*  7/2008  Rahman et al. ......... 375/319

\* cited by examiner

*Primary Examiner*—Nhan Le
(74) *Attorney, Agent, or Firm*—Bever, Hoffman & Harms, LLP; Jeanette S. Harms

(57) ABSTRACT

The present invention discloses an automatic gain controller with an amplifier (10) having an amplifier output connected to a mixer (20) and a receiver signal strength indicator (100) connected to the amplifier output and to a first counter (60). The first counter (60) is adapted to produce a signal to control gain of the amplifier (10) and receives its input from the receiver signal strength indicator (100) which causes the first counter (60) to count up or down depending on the strength of the signal output from the amplifier (10). The automatic gain controller also includes a second counter (70) which is connected to an applications circuit and is adapted to produce a signal to control gain of the mixer (20). The second counter (70) receives its input from a gain control signal from the applications circuit (50) and also from the first counter (60).

15 Claims, 1 Drawing Sheet

AMPLIFIER GAIN CONTROL

TECHNICAL FIELD OF THE INVENTION

The invention describes an automatic gain controller for automatically controlling the gain of several amplifiers in a receive chain.

BACKGROUND OF THE INVENTION

Automatic gain controllers for amplifiers are known in the art. These prior art controllers are used to control the gain of amplifier and to adjust the gain of the amplifier depending on the strength of an incoming signal. Such amplifier gain controllers are used, for example, to provide an input signal to an applications circuit.

SUMMARY OF THE INVENTION

The invention provides an amplifier gain controller with an amplifier having an amplifier output connected to a mixer. The mixer is adapted to down convert an incoming signal and to supply the down converted incoming signal to an application circuit. A receiver signal strength indicator is provided which is connected to the amplifier output and to a first counter. The first counter is adapted to produce a signal to control gain of the amplifier. A second counter is connected to the application circuit and being adapted to produce a signal to control gain of the mixer.

In one aspect of the invention, the first counter has a maximum output line and a minimum output line connected to the second counter. The second counter is adapted to maximize the gain of the mixer on receipt of a signal on the minimum output line and is adapted to minimize the gain of the mixer on receipt of a signal on the maximum output line.

The receiver signal strength indicator is adapted to change a first counter value in the first counter when the output signal of the amplifier passes at least one of a plurality of threshold values and wherein the first counter value is transmittable to the amplifier to control gain of the amplifier. On the other hand, the second counter receives a gain control signal from the applications circuit which is adapted to change a second counter value in the second counter.

In one aspect of the invention, the controller further includes a programmable gain amplifier connected between the applications circuit and the mixer. The programmable gain amplifier is adapted to supply a signal with a substantially constant amplitude to the applications circuit.

In order to calibrate the receiver signal strength indicator, an analogue-digital converter is connected to the receiver signal strength indicator and a comparator connected across an output of the analogue-digital converter and a threshold-value register. The comparator has an output connected to the first counter. It should be noted that a plurality of threshold-value registers and a plurality of comparators can be connected to the output of the receiver signal strength indicator and the outputs of the plurality of comparators are connected to the first counter and ones of the inputs of the plurality of comparators are connected to different ones of the plurality of threshold-value registers.

The invention also provides a method of controlling the gain of a circuit with an amplifier and a mixer in which the output of the amplifier is detected and the value of a first counter is changed dependent on the output of the amplifier. The value of the first counter is passed to an input of the amplifier and thus the gain of the amplifier is adjusted. The value of a second counter is dependent on a control signal from an application circuit and the value of the second counter is passed to the mixer, thus adjusting the gain of the mixer.

The method also includes passing from the first counter a max/min signal to the second counter when the first counter reaches one of a maximum value or a minimum value and changing the value of the second counter dependent on the max/min signal and thus adjusting the gain of the mixer.

In one aspect of the invention, the method also includes the detection of the output of the amplifier by comparing the output of the amplifier with a threshold value and passing a signal to the first counter indicative of whether the output of the amplifier is above or below the threshold value.

DETAILED DESCRIPTION OF THE PREFERRED EMBODIMENTS OF THE INVENTION

Figure 1:
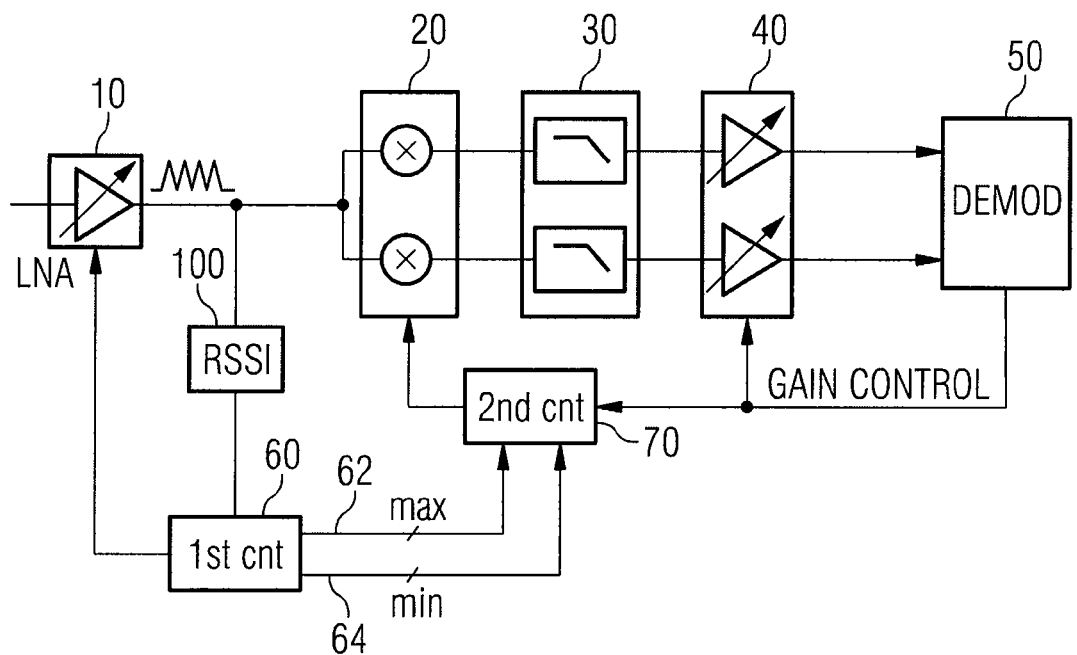
FIG. 1 illustrates a block diagram of an automatic gain control for an amplifier according to the invention.

FIG. 1 shows the amplifier gain control (AGC) 5 of the present invention. The AGC 5 has a first low-noise amplifier (LNA) 10 with an output which is connected to a mixer stage 20. The input signals are typically single-ended and are converted to differential signals before passage to the mixer stage 20. The function of the mixer stage 20 is to down convert the incoming signals (typically at RF frequency) to low frequency signals centered on DC. The mixer stage 20 will have a gain control which is connected to a second counter 70 as explained later.

An input of the LNA 10 is connected to a first counter 60 which function will be explained later. The LNA 10 receives an antenna input signal and amplifies the antenna input signal to produce an amplifier output signal. The output of the mixer stage 20 is connected to the input of a low pass filter 30. The low pass filter 30 is used to eliminate out-of-band interference produced by the mixer stage 20. The output of the low pass filter 30 is connected to a programmable gain amplifier 40. The output of the programmable gain amplifier 40 is connected to a demodulator 50 and from thence to an applications circuit. The function of the programmable gain amplifier 40 is to ensure that the differential signal received by the demodulator 50 (and subsequently processed by the application circuit) is of substantially uniform power. As a result, the output voltage of the programmable gain amplifier 40 is held at a substantially constant amplitude. The information about the degree of amplification in the programmable gain amplifier 40 is fed from the programmable gain amplifier to the second counter 70.

The demodulator 50 has a signal GAIN_CONTROL that is passed back to the programmable gain amplifier 40 indicating whether the gain of the programmable gain amplifier 40 needs to be increased or decreased in order to ensure that the power supplied to the demodulator 50 is substantially uniform. The signal GAIN_CONTROL is also passed to the second counter 70. The second counter 70 also receives two values from the first counter 60: a maximum value flag on line 62 and a minimum value flag on line 64. The purpose of the two values will be explained later. The second counter 70 is connected to the mixer stage 20 to control the gain of the mixer stage 20.

A received signal strength indicator (RSSI) 100 is connected to the output of the low noise amplifier 10 and to an input of the first counter 60 and is used to measure the strength of the amplifier output signal from the low noise amplifier 10. As will be explain in more detail later, the purpose of the received signal strength indicator (RSSI) 40 is to increase the gain in the low noise amplifier 10 if required.

The low noise amplifier 10 in the example of the invention has several gain settings from 0 db to 24 dB in intervals of 6 dB. The values of the gain settings are merely indicative and not limiting of the invention. The gain settings of the LNA 10 are controlled by the first counter 60 by use of a programmable table of threshold values. For example, when the first counter 60 outputs a certain (integer) value, the gain setting of the LNA 10 will remain at one level. When the output of the first counter 60 changes (i.e. goes up or down) within a range of the certain values, then the gain setting of the LNA 10 will change accordingly (i.e. will increase or decrease).

The first counter 60 receives its input from the RSSI 100. The RSSI 100 causes the first counter 60 to either count down or count up when the output signal of the LNA 10 exceeds or falls below certain threshold values.

As noted above the second counter 70 is connected to the mixer 20. The mixer 20 has a gain from 0 dB to 30 dB in steps of 6 dB and the value of the gain is controlled by a numerical value given from the second counter 70. It should be noted that the values of the gain of the mixer 20 are merely illustrative and not limiting of the invention. The second counter 70 receives an input from the programmable gain amplifier 40 and the demodulator 50 and adjusts the gain of the mixer stage 20 depending on this input. If the signal reaching the programmable gain amplifier 40 is so weak that the programmable gain amplifier 40 is stretched towards its maximum limit (i.e. the gain goes above a predefined level), then a counter signal is sent to the second counter 70. In this case, the counter signal will indicate that the second counter 70 should increase the numerical value and thus increase the gain in the mixer 20.

If the signal reaching the programmable gain amplifier 40 is so strong that the programmable gain amplifier 40 is stretched towards its minimum limit (gain below a predefined level), then a counter signal is sent to the second counter 70. In this case, the counter signal will indicate that the second counter 70 should decrease the numerical value and thus decrease the gain in the mixer 20.

The second counter 70 as noted above receives from the first counter 60 a maximum value flag on the line 62 and a minimum value flag on the line 64. The maximum value flag indicates that the first counter 60 has reached its maximum value. In this case the second counter 70 sets the gain of the mixer stage 20 to maximum gain. This would happen, for example, if the amplifier input signal to the LNA 10 was very weak. The RSSI 100 would detect the amplifier output signal of the LNA 10 and the RSSI would increase the value in the first counter 60 to increase the gain of the LNA 10. However, there is a limit to the gain of the LNA 10 and if this limit is reached, then the gain of the LNA 10 cannot be increase further. In order to be able to detect the input signal at the demodulator 50, the input signal must be amplified in other stages of the circuit.

On the other hand, if the minimum value flag is sent from the first counter 60 to the second counter 70, then the gain of the mixer stage 20 is set to a minimum. This would be the case in which the amplifier input signal to the LNA 10 was so strong that little or no amplification would be required. In effect, the maximum value flag and the minimum value flag override the numerical values stored in the second counter 70.

Figure 2:
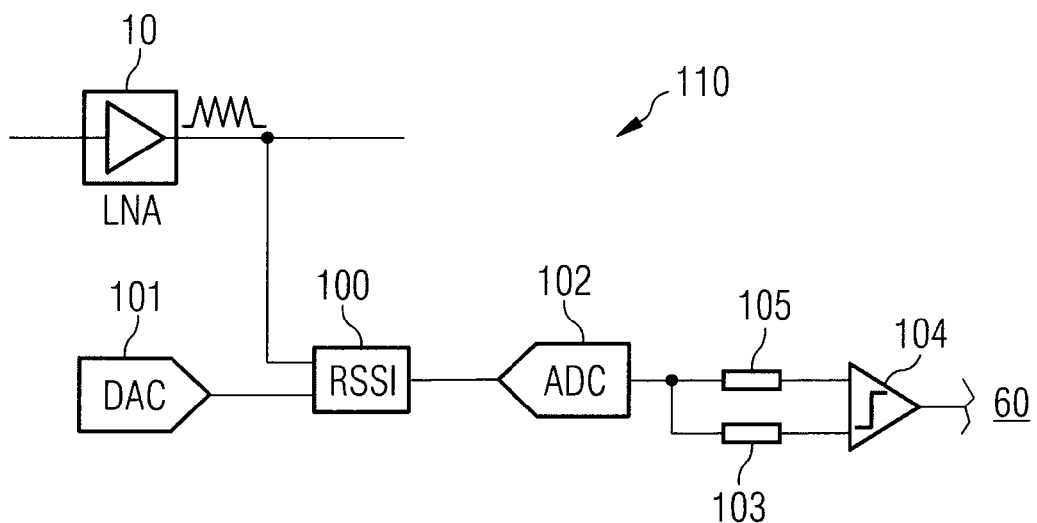
FIG. 2 illustrates a block diagram of a calibration circuit for a received signal strength indicator.

Calibration of the RSSI 100 is carried out using a calibration circuit 110 as shown in FIG. 2. The calibration circuit 110 comprises a digital analogue converter 101 connected to an input of the RSSI 100 and an analogue-digital converter (ADC) 102 connected to an output of the RSSI 100. A first register 103 stores a threshold value and a second register 105 stores a measured value as will be described below. A comparator 104 compares the measured value in the second register with the threshold value stored in the first register and produces a signal which is passed to the first counter 60.

The calibration of the RSSI 100 is carried out on initialization as follows. A digital-to-analogue converter (DAC) 101 produces a DC signal with a known amplitude. This DC signal is passed to the RSSI which outputs a result to the first register 103. The output value of the RSSI, when the DC signal in applied, is proportional to the RF input signal since the RSSI block frequency transfer function is constant. The result stored in the first register 103 is thus the threshold value for the RSSI 100 for the known amplitude. This means that in operation the RSSI 100 receives as an input the output of the LNA 10. The output of the RSSI 100 is converted to a digital value in the ADC 102 and then passed to the second register 105. The comparator 104 compares the value in the second register 105 with the threshold value in the first register 103 stored during calibration and produces an output which is indicative whether the value stored in the second register 105 is greater or less than the threshold value stored in the first register 103. The output of the comparator 104 is then used to count the first counter up or down. In FIG. 2 only one first register 103 is shown for simplicity. In practice, there will be a plurality of first registers 103 with different threshold values and a plurality of comparators 104 connected between ones of the first registers and the second register 105. The plurality of first registers 103 (which forms the lookup table described above) will be fed with threshold values by producing different values from the DAC 101 on initialization.

While various embodiments of the present invention have been described above, it should be understood that they have been presented by way of example, and not limitation. It will be apparent to persons skilled in the relevant arts that various changes in form and detail can be made therein without departing from the scope of the invention. For example, in addition to using hardware (e.g., within or coupled to a Central Processing Unit ("CPU"), microprocessor, microcontroller, digital signal processor, processor core, System on Chip ("SOC"), or any other device), implementations may also be embodied in software (e.g., computer readable code, program code and/or instructions disposed in any form, such as source, object or machine language) disposed, for example, in a computer usable (e.g., readable) medium configured to store the software. Such software can enable, for example, the function, fabrication, modeling, simulation, description and/or testing of the apparatus and methods described herein. For example, this can be accomplished through the use of general programming languages (e.g., C, C++), hardware description languages (HDL) including Verilog HDL, VHDL, SystemC Register Transfer Level (RTL), and so on, or other available programs. Such software can be disposed in any known computer usable medium such as semiconductor, magnetic disk, optical disk (e.g., CD-ROM, DVD-ROM, etc.). Embodiments of the present invention may include methods of providing an apparatus described herein by providing software describing the apparatus and subsequently transmitting the software as a computer data signal over a communication network including the Internet and intranets.

It is understood that the apparatus and method embodiments described herein may be included in a semiconductor intellectual property core, (e.g., embodied in HDL) and transformed to hardware in the production of integrated circuits. Additionally, the apparatus and method embodiments described herein may be embodied as a combination of hardware and software. Thus, the present invention should not be limited by any of the above-described exemplary embodiments, but should be defined only in accordance with the following claims and their equivalence. Furthermore, it should be appreciated that the detailed description of the present invention provided herein, and not the summary and abstract sections, is intended to be used to interpret the claims. The summary and abstract sections may set forth one or more but not all exemplary embodiments of the present invention.

The invention claimed is:

1. An amplifier gain controller comprising:
   an amplifier with an amplifier output connected to a mixer, wherein the mixer is adapted to down convert an incoming signal and to supply the down converted incoming signal to an application circuit;
   a receiver signal strength indicator connected to the amplifier output and to a first counter, wherein the first counter being adapted to produce a signal to control gain of the amplifier;
   a second counter connected to the application circuit and being adapted to produce a signal to control gain of the mixer;
   wherein the first counter has a maximum output line and a minimum output line connected to the second counter and wherein the second counter is adapted to maximize the gain of the mixer on receipt of a signal on the minimum output line and is adapted to minimize the gain of the mixer on receipt of a signal on the maximum output line.

2. The controller of claim 1, wherein the receiver signal strength indicator is adapted to change a first counter value in the first counter when the output signal of the amplifier passes at least one of a plurality of threshold values and wherein the first counter value is transmittable to the amplifier to control gain of the amplifier.

3. The controller of claim 1, wherein the second counter receives a gain control signal from the applications circuit which is adapted to change a second counter value in the second counter.

4. The controller of claim 1, further comprising a programmable gain amplifier connected between the applications circuit and the mixer, wherein the programmable gain amplifier is adapted to supply a signal with a substantially constant amplitude to the applications circuit.

5. The controller of claim 1, wherein an output of the programmable gain amplifier is connected to the second counter.

6. The controller of claim 1, further comprising a low-pass filter.

7. The controller of claim 1, wherein an analogue-digital converter is connected to the receiver signal strength indicator and a comparator connected across an output of the analogue-digital converter and a threshold-value register, wherein the comparator has an output connected to the first counter.

8. The controller of claim 7, further comprising a plurality of threshold-value registers and a plurality of comparators connected and wherein the outputs of the plurality of comparators are connected to the first counter and ones of the inputs of the plurality of comparators are connected to different ones of the plurality of threshold-value registers.

9. The controller of claim 1, further comprising a digital-to-analogue converter connected to an input of the receiver signal strength indicator.

10. A method of controlling the gain of a circuit with an amplifier and a mixer comprising:
    detecting the output of the amplifier;
    changing the value of a first counter dependent on the output of the amplifier;
    passing the value of the first counter to an input of the amplifier and thus adjusting the gain of the amplifier;
    changing the value of a second counter dependent on a control signal from an application circuit; and
    passing the value of the second counter to the mixer and thus adjusting the gain of the mixer;
    passing from the first counter a max/min signal to the second counter when the first counter reaches one of a maximum value or a minimum value; changing the value of the second counter dependent on the max/min signal and thus adjusting the gain of the mixer.

11. The method of claim 10, further comprising adjusting the gain of a programmable gain amplifier connected to an output of the mixer.

12. The method of claim 10, wherein the detection of the output of the amplifier comprises comparing the output of the amplifier with a threshold value and passing a signal to the first counter indicative of whether the output of the amplifier is above or below the threshold value.

13. The method of claim 12, further comprising generating a plurality of threshold values.

14. A computer program product embodied on a non-transitory computer-readable medium and comprising executable instructions for the manufacture of an amplifier gain controller comprising:
    an amplifier with an amplifier output connected to a mixer;
    a receiver signal strength indicator connected to the amplifier output and to a first counter, wherein the first counter being adapted to produce a signal to control gain of the amplifier;
    a second counter connected to an applications circuit and being adapted to produce a signal to control gain of the mixer;
    wherein the first counter has a maximum output line and a minimum output line connected to the second counter and wherein the second counter is adapted to maximize the gain of the mixer on receipt of a signal on the minimum output line and is adapted to minimize the gain of the mixer on receipt of a signal on the maximum output line.

15. The computer program product of claim 14, wherein the executable instructions are programmed in a hardware description language selected from the group consisting of Verilog, VHDL and RTL.

* * * * *

UNITED STATES PATENT AND TRADEMARK OFFICE
CERTIFICATE OF CORRECTION

PATENT NO.         : 7,881,685 B2                                           Page 1 of 1
APPLICATION NO.    : 11/968108
DATED              : February 1, 2011
INVENTOR(S)        : Ricardo dos Santos Reis It is certified that error appears in the above-identified patent and that said Letters Patent is hereby corrected as shown below:

Column 6
Line 16, delete "and".
Line 21, insert --and-- after "value;".
Line 21, begin a new paragraph at "changing".

Signed and Sealed this
Third Day of May, 2011

David J. Kappos
*Director of the United States Patent and Trademark Office*